US00RE50712E

(19) United States
(12) Reissued Patent
Forghani-Zadeh et al.

(10) Patent Number: US RE50,712 E
(45) Date of Reissued Patent: Dec. 23, 2025

(54) MULTI-SUPPLY OUTPUT CIRCUIT

(71) Applicant: Texas Instruments Incorporated, Dallas, TX (US)

(72) Inventors: Hassan Pooya Forghani-Zadeh, Fort Worth, TX (US); Timothy Bryan Merkin, Richardson, TX (US)

(73) Assignee: TEXAS INSTRUMENTS INCORPORATED, Dallas, TX (US)

(21) Appl. No.: 16/569,358

(22) Filed: Sep. 12, 2019

Related U.S. Patent Documents

Reissue of:
(64) Patent No.: 9,762,242
Issued: Sep. 12, 2017
Appl. No.: 14/969,451
Filed: Dec. 15, 2015

U.S. Applications:
(60) Provisional application No. 62/096,657, filed on Dec. 24, 2014.

(51) Int. Cl.
*H03K 3/00* (2006.01)
*H03K 19/0175* (2006.01)

(52) U.S. Cl.
CPC ..... *H03K 19/017509* (2013.01)

(58) Field of Classification Search
CPC ..... H03K 3/00; H03K 19/0175; H03K 19/017509
USPC ..... 327/109
See application file for complete search history.

(56) References Cited

U.S. PATENT DOCUMENTS 6,104,653 A * 8/2000 Proebsting ..... G11C 7/065 257/E21.659
7,119,579 B2 * 10/2006 Chong ..... G06F 1/24 326/38
7,196,940 B1 * 3/2007 Vadi ..... G11C 7/20 365/185.24
7,560,975 B2 * 7/2009 Itoh ..... G11C 5/146 326/31
2009/0108906 A1 * 4/2009 Butler ..... H04N 5/268 327/387
2013/0234779 A1 * 9/2013 Klug, Jr. ..... H03K 17/04123 327/432

OTHER PUBLICATIONS

"USB Charging Port Controller and Power Switch with Load Detection", Texas Instruments, TPS2546, SLVSbJ2A, Feb. 2013, Revised Feb. 2013, 40 pgs.

(Continued)

*Primary Examiner* — My Trang Ton
(74) *Attorney, Agent, or Firm* — Mandy Barsilai Fernandez; Frank D. Cimino

(57) ABSTRACT

Disclosed examples include ICs and general-purpose I/O circuitry to facilitate interfacing of the IC with a variety of external circuits operating at different supply voltages, in which an integer number N supply drive circuits are individually coupled with a corresponding supply voltage node and selectively connect the corresponding supply voltage node to a general-purpose output node based on a supply drive control signal to allow programmable interfacing of individual general-purpose output pads or pins of the IC with an external circuit at the appropriate signal level.

12 Claims, 3 Drawing Sheets

(56) References Cited

OTHER PUBLICATIONS

"Universal Serial Bus Power Delivery Specification", Revision 2.0, V1.0, Aug. 11, 2014, Section 2—Overview, cover sheet and pp. 41-56.
"Universal Serial Bus Power Delivery Specification", Revision 2.0, V1.0, Aug. 11, 2014, Section 5—Physical Layer, pp. 102-140.
"Universal Serial Bus Power Delivery Specification", Revision 2.0, V1.0, Aug. 11, 2014, Section 6—Protocol Layer, pp. 141-207.
"Universal Serial Bus Power Delivery Specification", Revision 2.0, V1.0, Aug. 11, 2014, Section 8—Device Policy, Part 1 (pp. 268-350) and Part 2 (pp. 351-450).
"Universal Serial Bus Type-C Cable and Connector Specification", Revision 1.0, Aug. 11, 2014, USB 3.0 Promoter Group, Part 1 (pp. 1-84) and Part 2 (pp. 85-171).

* cited by examiner

MULTI-SUPPLY OUTPUT CIRCUIT

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

REFERENCE TO RELATED APPLICATION

Under 35 U.S.C. §119, this application claims priority to, and the benefit of, U.S. provisional patent application Ser. No. 62/096,657, entitled "MULTI-SUPPLY OUTPUT BUFFER CIRCUIT", and filed on Dec. 24, 2014, the entirety of which is hereby incorporated by reference. *The present application is a reissue of U.S. application Ser. No. 14/969,451 filed Dec. 15, 2015, now U.S. Pat. No. 9,762,242.*

TECHNICAL FIELD

The present disclosure relates to integrated circuits (ICs), and more particularly to output buffers with configurable supply voltage connections.

BACKGROUND

Application specific integrated circuits (ASICs) and other types of ICs often include general-purpose I/O pins or pads used for interfacing with external circuitry. General-purpose outputs in particular allow firmware, software or other logic to control the logic state of an IC pin, and thus provide flexibility to use the IC in a variety of different system applications. In many host systems, however, external circuitry is powered from different supply voltages, and a general-purpose output buffer needs to operate from the supply level corresponding to the voltage supplied to the associated external circuit to ensure the data sent to the output is properly received. For example, one external circuit may operate at 5 V, while a second operates at 3.3 V, and a third external circuit operates at 1.8 V. To ensure that signals provided from a general-purpose output can be properly received by an external circuit, the corresponding supply voltage must be provided to the general-purpose output circuit. However, this requires the addition of an extra voltage supply pin for each configurable or programmable output buffer. External level shifting circuitry, can be used to interface the general-purpose output with external circuitry, but that increases the cost and complexity of a given system design.

SUMMARY

Disclosed examples include circuits with multiple supply voltage nodes to deliver different supply voltage signals, and output circuitry that is configurable to operate with multiple supply voltages. An output circuit includes an output node to selectively provide an output signal to an associated IC pin, as well as multiple supply drive circuits. The individual supply drive circuits operate in a first mode to electrically connect an associated supply voltage node to the output node according to a control signal to drive output data at an appropriate level, and in a second mode to disconnect the supply voltage from the output node. In certain examples, a blocking circuit is provided in one or more of the supply drive circuits to block current flow from the output node to the associated supply voltage node when the supply drive circuit is in the second mode. A logic circuit of the IC provides control signals to configure the supply drive circuits for a given system implementation in certain examples. In some examples, the output circuit includes a reset circuit to selectively place the output circuit in the second mode according to a reset input signal.

DETAILED DESCRIPTION

Figure 1:
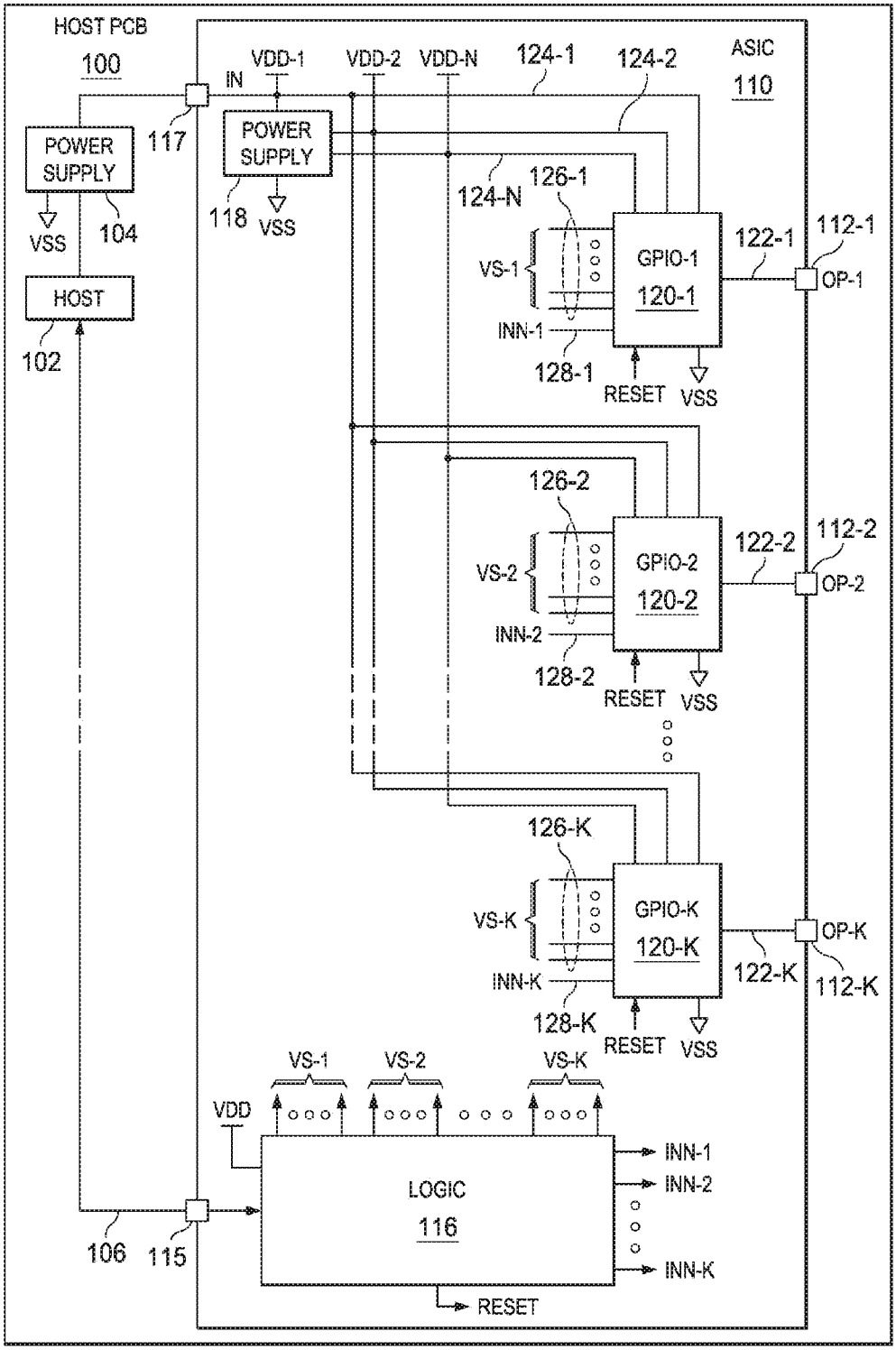
FIG. 1 is a schematic diagram of a host circuit board including an ASIC integrated circuit with multiple output circuits individually configurable to provide output data based on one of a plurality of supply voltage signals.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical connection or combinations thereof. For example, if a first device couples to or is coupled with a second device, that connection may be through a direct electrical connection, or through an indirect electrical connection via one or more intervening devices and connections.

FIG. 1 illustrates a host system printed circuit board (PCB) 100 which includes a host circuit 102, such as a processor in one example, and a power supply circuit 104 that provides input power to an integrated circuit 110. The integrated circuit 110 is an ASIC in this example, although the concepts of the present disclosure can be used in other types and forms of circuits including application-specific or general integrated circuits. The power supply 104 includes an output connected to a power input pin 117 (IN) to provide a first voltage signal VDD-1 with respect to a constant voltage node or connection VSS (e.g., ground). The IC 110 in one example includes an internal power supply circuit 118 that receives the first voltage supply signal VDD-1 and generates a second supply voltage signal VDD-2 relative to VSS. The first voltage supply signal VDD-1 is provided on a first supply voltage node 124-1, and the internal power supply 118 provides the second supply voltage signal VDD-2 on a second supply voltage node 124-2. In addition, the power supply 118 in this example includes one or more additional supply outputs to provide additional supply voltages, with the IC 110 including an integer number N supply voltage nodes 124-1, 124-2, . . . , 124-N to deliver N corresponding supply voltage signals VDD-1, VDD-2, . . . , VDD-N with respect to VSS, where N is greater than 1. In one non-limiting example, the IC 110 includes N=3 supply voltage nodes to deliver 1.8 V, 3.3 V and 5.0 V signals VDD-1, VDD-2 and VDD-N, although the presently disclosed examples are not limited to any particular supply voltage values. In the example of FIG. 1, some of the supply voltage signals are from external supplies, and one or more of the supply voltage signals are generated internal to the IC 110. In other examples, an integer number N supply voltage signals VDD-i can be provided to the IC 110 from external power supplies using corresponding input pins. In another example, one or more power supplies of the IC 110 can supply N supply voltage signals VDD-i.

The IC 110 also includes multiple general-purpose output nodes and corresponding output pins. In one example, an integer number K output nodes 122-1, 122-2, . . . , 122-K selectively provide or deliver output signals to corresponding output pins 112-1, 112-2, . . . , 112-K according to corresponding data signals INN-1, INN-2, INN-K, where K is greater than 1. The individual output nodes 122 and output pins 112 are associated with a corresponding one of K output circuits 120-1, 120-2, . . . , 120-K (labeled GPIO-1, GPIO-2, GPIO-N in the drawing). The individual output circuits 120 in this example are operatively coupled with the supply voltage nodes 124-1 through 124-N in order to receive the corresponding N supply voltage signals VDD-1 through VDD-N. The IC 110 also includes a logic circuit 116 operating from a supply voltage domain VDD. The logic circuit 116 provides voltage select or drive control signals VS to the individual output circuits 120. The output circuits 120-1, 120-2, . . . , 120-K include corresponding control inputs 126-1, 126-2, . . . , 126-K that receive sets of control signals VS-1, VS-2, . . . , VS-K from the logic circuit 116. In this example, each control signal set VS-j includes an integer number N signals to allow the logic circuit 116 to programmatically configure each individual output circuit 120 to use a corresponding one of the N supply voltage signals VDD-i, although not a strict requirement for all possible implementations of the disclosed examples.

In one example, the logic circuit 116 also provides K data signals INN-1, INN-2, . . . INN-K to data inputs 128-1, 128-2, . . . , 128-K of the corresponding output circuits 120-1, 120-2, . . . , 120-K. In the example of FIG. 1, the logic circuit 116 is operatively coupled with the host circuit 102 via one or more connections 106 and one or more IC pins 115 for data exchange with the host 102. The logic circuit 116 in one example provides the output data signals INN according to data received from the host circuit 102. In other examples, the data signals INN are provided to the output circuits 120 by another source or circuit (not shown). The output circuits 120 in certain examples may allow receipt of incoming data from the corresponding pin 112, and may be equipped with receiver buffers or amplifiers, and the transmit circuitry of the individual output circuits 120 may include tristate or other enable control circuitry (not shown) to allow one or more of the general-purpose I/O pins OP to be defined as inputs. The IC 110 provides a general-purpose I/O system with individual supply drive circuits 200 to selectively connect the corresponding supply voltage node 124 to the output node 122 when the corresponding supply drive control signal VS is in a first state (e.g., HI) and a data signal INN is in a first state (e.g., HI), and to otherwise disconnect the corresponding supply voltage node 124 from the output node 122. The logic circuit 116 also provides a RESET signal to corresponding reset inputs of the individual output circuits 120 in one example.

Figure 2:
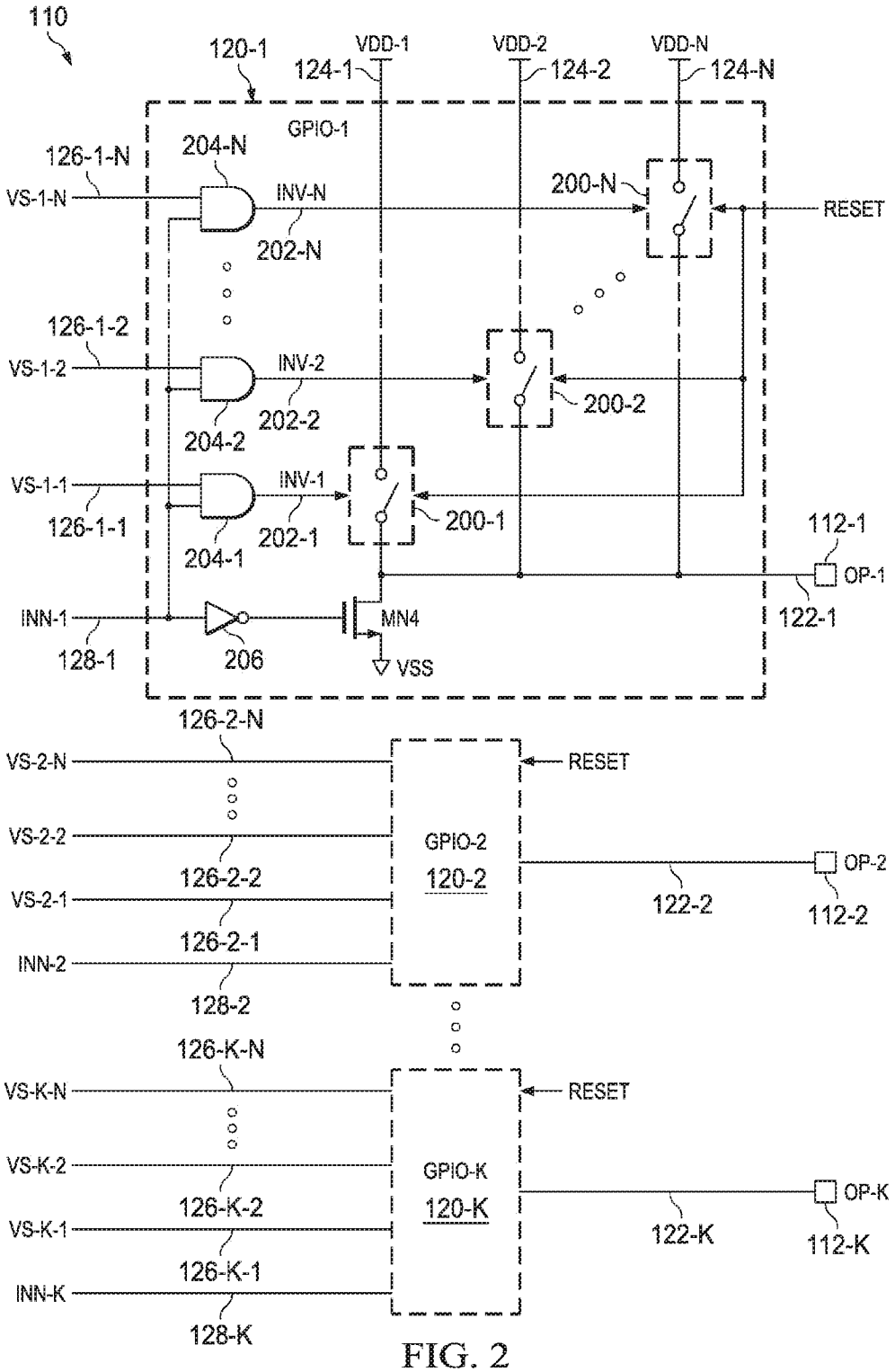
FIG. 2 is a schematic diagram of one of the output circuits including multiple supply drive circuits individually associated with a corresponding supply voltage node.

FIG. 2 shows further details of one of the output circuits 120-1 in the IC 110 of FIG. 1, including multiple supply drive circuits 200-1 . . . 200-N which are individually associated with a corresponding supply voltage node 124-1 . . . 124-N. The output circuit 120-1 also includes an output node 122-1 to provide an output signal OP-1 to the IC pin 112-1 according to the corresponding data signal INN-1 received at the data input line or node 128-1. The individual supply drive circuits 200 operate in a first mode (e.g., ON) to electrically connect an associated supply voltage node 124 to the output node 122 according to a control signal VS to drive output data at an appropriate level set by the selected supply voltage signal VDD-i. The drive circuits 200 operate in a second mode (e.g., OFF) to disconnect the supply voltage from the output node 122 when the control signal VS is LO and/or when the data signal INN is LO. Any suitable switching circuitry can be employed in the individual supply drive circuits 200, which are shown in FIG. 2 implementing a switch to selectively connect the corresponding voltage supply node VDD-i with the output node 122-1. In addition, the RESET signal is provided as an input to the individual supply drive circuits 200-1, 200-2, . . . , 200-N. In one possible implementation of the IC 110, the output circuits 120-2 through 120-K are constructed in similar fashion to the circuitry shown in FIG. 2 for the output circuit 120-1.

As seen in FIG. 2, the output circuit 120-1 includes N supply drive circuits 200-1, 200-2, . . . , 200-N which are individually associated with a corresponding one of the N supply voltage nodes 124-1, 124-2, . . . , 124-N. The individual supply drive circuits 200 are associated with a corresponding AND gate 204 with inputs to receive a corresponding supply drive control signal VS-1-1, VS-1-2, . . . , VS-1-N and the data signal INN-1, and an output 202 providing a signal INV to control the corresponding supply drive circuit 200. The supply drive circuits 200 in this example operate in a first mode (e.g., ON) in response to receiving the corresponding supply drive control signal VS-1-1, VS-1-2, . . . , VS-1-N in a first state (e.g., HI) and receipt of the data signal INN-1 in a first state (e.g., HI) to selectively connect the corresponding supply voltage node 124 to the output node 122. In response to receiving the supply drive control signal VS in a different second state (e.g., LO), the individual supply drive circuits 200 operate in a second mode (e.g., OFF) to disconnect the corresponding supply voltage node 124 from the output node 122-1.

In operation in the IC 110 of FIG. 1, the logic circuit 116 provides a single one of the supply drive control signals VS in the first state HI and provides the other supply drive control signals VS in the second state LO for each of the K output circuits 120. By this operation, the general-purpose output pins 112 can be programmed by the logic circuit 116 to provide flexibility to match the supply voltage level of a corresponding pin 112 with the supply voltage level of the corresponding external circuit to which it is connected, without unnecessarily adding excessive numbers of pins to the IC 110. In this manner, only a few supply pins are added in order to receive supply voltage signals VDD-i from external sources (or no pins need be added if the supply voltage signals VDD-i are generated internal to the IC 110). In addition, the logic circuit 116 and the output circuits 120 are individually configured to use the appropriate supply voltage signal VDD-i in providing the output signals OP-j. For example, the IC 110 may include 10 general-purpose I/O pins (K=10) and external circuitry on the host PCB 100 in FIG. 1 uses one of two supply rails (e.g., 1.8 V and 3.3 V, where N=2) from external power supplies (not shown). In this case, two pins of the IC 110 are used to receive 1.8 V and 3.3 V supply voltage signals VDD-1 and VDD-2, and each of the output pins 112-1 through 112-10 can be configured to operate with either of the 1.8 V or 3.3 V domains. Other circuitry can be included, for example, anti-shoot through (break before make) circuits or additional buffering for increasing drive and speed (not shown).

In the example of FIG. 2, the first output circuit 120-1 includes an input 128-1 to receive the data signal INN-1

(e.g., from the logic circuit 116 in FIG. 1 in one example), along with a first supply drive control input 126-1-1 to receive a first supply drive control signal VS-1-1, a second supply drive control input 126-1-2 which receives a second supply drive control signal VS-1-2, as well as an Nth supply drive control input 126-1-N an Nth supply drive control signal VS-1-N. This allows the logic circuit 116 to selectively designate one of the supply voltage signals VDD-1, VDD-2, VDD-N for use by the first output circuit 120-1. Similarly, the second output circuit 120-2 in FIG. 2 has a data input 128-2 which receives a data signal INN-2, along with inputs 126-2-1, 126-2-2, . . . , 126-2-N which receive supply drive control signals VS-2-1, VS-2-2, . . . , VS-2-N. The Kth output circuit 120-K includes a data input 128-K which receives a data signal INN-K, along with inputs 126-K-1, 126-K-2, . . . , 126-K-N which receive supply drive control signals VS-K-1, VS-K-2, . . . , VS-K-N. The logic circuit 116 in one example provides one of the supply drive control signals VS-j-1, VS-j-2, . . . , VS-j-N in the first state (e.g., HI), and provides the remaining supply drive control signals for a given output circuit 120 in the second state (e.g., LO).

Figure 3:
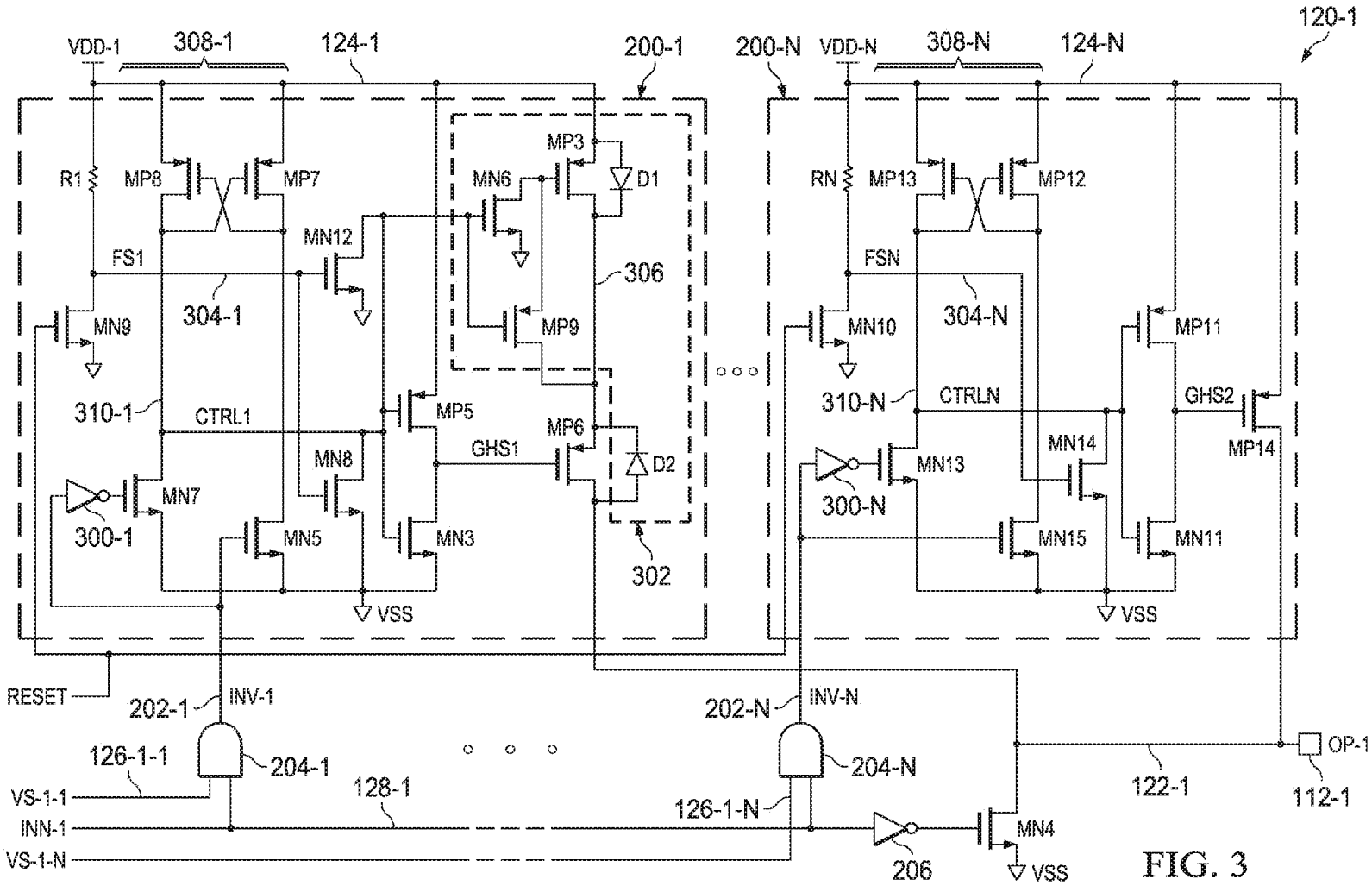
FIG. 3 is a schematic diagram illustrating a circuit implementation of two of the supply drive circuits in FIG. 2.

FIG. 3 shows a circuit implementation of two of the supply drive circuits 200-1 and 200-N in the first output circuit 120-1 of FIG. 2. The first supply drive circuit 200-1 in this example includes an input 202-1 which receives a first signal INV-1 from the output signal from the AND gate 204-1. The circuit 200-1 includes an inverter 300-1 and transistors MP7, MP8, MN7 and [MN8] *MN5* that form a first level shift circuit 308-1. The level shift circuit 308-1 includes an input at line or node 202-1 which receives the first signal INV-1 from the first AND gate 204-1. The level shift circuit 308-1 also includes an output 310-1 which provides a first control signal CTRL1. The first control signal CTRL1 is the received input signal INV-1 shifted from a digital (e.g., VDD) domain to the domain of the first supply voltage signal VDD-1. The circuit 200-1 also includes an inverter formed by transistors MP5 and MN3, whose gates form an inverter input to receive the first control signal CTRL1. An inverter output is formed by the node joining the drains of MP5 and MN3 to provide a high side gate control signal GHS1 to control the gate of a first output transistor MP6. The source or a first terminal of the transistor MP6 is coupled with the first supply voltage node 124-1, and the drain or second terminal of MP6 is connected to the first output node 122-1. The gate control signal of MP6 receives the first control signal CTRL1 to turn the first output transistor MP6 on when the first supply drive circuit 200-1 is in the first mode (e.g., ON), and to turn MP6 off when the first supply drive circuit 200-1 is in the second mode (OFF). In addition, the first supply drive circuit 200-1 includes a failsafe reset circuit formed by resistor R1, a node 304-1 and transistors MN8, MN9, and MN12 to generate a first failsafe signal F81 according to the RESET signal from the logic circuit 116 in FIG. 1.

The second illustrated supply drive circuit 200-N in FIG. 3 includes a second level shifting circuit 308-N formed by an inverter 300-N and transistors MP12, MP13, MN13 and MN 15 that receives and shifts a signal INV-N received at the input 202-N to provide a second control signal CTRLN at a level shifter output node 310-N. The control signal CTRLN is received at the input of an inverter formed by transistors MP11 and MN11. The output of the inverter circuit MP11, MN11 provides a high side gate control signal GHS2 to a gate control terminal of an output transistor MP14 connected between the supply voltage node 124-N and the first output node 122-1. The second supply drive circuit 200-N also provides a failsafe reset circuit including a resistor RN and transistors MN10 and MN14 to generate a failsafe signal FSN at a node 304-N.

The first and second supply drive circuits 200-1 and 200-N in FIG. 3 operate in similar fashion according to the corresponding input signals INV-1 and INV-N from the AND gates 204-1 and 204-N, respectively. In the first driver supply circuit 200-1, when the RESET signal is active HI, MN9 is turned on, and the voltage at node 304-1 is pulled to approximately VSS. This turns off transistors MN8 and MN12 to allow the remainder of the supply drive circuit 200-1 to operate normally. In this condition, the input signal INV-1 is LO until both a HI data signal state INN-1 and a HI control signal VS-1-1 are received. If the control signal VS-1-1 is LO or if the data signal INN-1 is LO, the INV-1 signal at the input 202-1 is LO. A low INV-1 signal turns off MN5 and turns on MN7 which pulls the node 310-1 to VSS, and the first control signal CTRL1 is LO. When the INV-1 signal is HI, MN7 is off and MN5 is on, which causes MP8 to turn on and pull the voltage at node 310-1 up to VDD-1 to provide a HI control signal CTRL1. A HI CTRL1 signal provides a LO GHS 1 signal through the inverter MP5, MN3, which turns on the output transistor MP6 to couple the VDD-1 voltage signal to the output node 122-1. Alternatively, when INV-1 is LO (based on VS-1-1 being LO and/or INN-1 being LO), GHS1 is HI and MP6 is turned off through operation of the level shifter circuit 308-1 and the inverter MP5, MN3.

The second supply drive circuit 200-N provides similar operation with respect to the INV-N signal. When INV-N is HI indicating that the supply voltage VDD-N has been selected by the logic circuit 116 via the signal VS-1-N and the data signal INN-1 is HI, the second control signal CTRLN at node 310-N is HI, and the gate control signal GHSN for the output transistor MP14 is LO, which turns on MP14 and connects VDD-N to the output node 122-1. Otherwise, INV-N and CTRLN are LO, GHSN is HI and MP14 is off.

The RESET signal provides a failsafe feature for the circuits 200 with respect to the VDD domain. In normal operation, the logic circuit 116 of FIG. 1 provides a HI signal RESET (at VDD). In one example, the VDD supply voltage signal provides power for the logic circuit 116 and other digital circuitry of the IC 110 including the AND gates 204 and the inverters 300 in FIG. 3. In the first circuit 200-1, for example, MN12, R1, MN8, and MN9 (as well as transistor MN 12) provide a failsafe network for the VDD domain. If the VDD signal is not available, the signal RESET is undefined, and will be zero. In this condition, MN9 is turned off, and R1 pulls up the node 304-1 to VDD-1 (FS1 HI). This condition turns on MN8 to disable the output transistor MP6 independent of the control signal VS-1-1 and the data signal INN-1. The failsafe circuitry RN, MN10 and MN14 provide similar functionality in the circuit 200-N to allow the output transistor MP14 to operate according to the INV-N signal while the RESET signal is HI, and to disable (e.g., turn off) MP14 when the reset signal RESET is low, independent of the INV-N signal.

As further shown in FIG. 3, moreover, one or more of the supply drive circuits 200 for a given one of the output circuits 120 includes a blocking circuit 302 to block current flow from the first output node 122-1 to the corresponding voltage node 124. In certain examples, a blocking circuit 302 is provided in all the supply drive circuits 200 to block current flow from the output node to the associated supply voltage node when the associated supply drive circuit 200 is in the second mode (OFF). In other examples, a blocking circuit 302 can be provided in all the drive circuits 200 except the drive circuit 200 associated with the highest supply voltage signal VDD-i. This is useful, for example, where the supply voltage VDD-1 is lower than one or more of the other selectable supply voltage signals VDD-i. In the example of FIG. 3, for instance, where VDD-N is greater than VDD-1, the blocking circuit 302 in the first supply drive circuit 200-1 prevents current flow from the output node 122-1 through the circuit 200-1 to the lower supply voltage node 124-1 associated with VDD-1, even when the second supply drive control signal VS-1-N is activated in the first state (HI). In one example, where VDD-N is 3.3 V, and the associated output transistor MP 14 of the circuit 200-N is turned on, the voltage at the output node 122-1 will be approximately 3.3 V. In this case, the first supply drive circuit 200-1 is off, and the blocking circuit 302 prevents current from flowing back to the lower (e.g., 1.8 V) VDD-1 supply voltage node 124-1.

As seen in FIG. 3, the blocking circuit 302 includes a first transistor MP3 connected in series with MP6 between the supply voltage node 124-1 and the output node 122-1. A first (e.g., source) terminal of MP3 is connected to the first supply voltage node 124-1 and a second (e.g., drain) terminal of MP3 is connected to a first node 306. The source terminal of MP6 is connected to the node 306, and the drain of MP6 is connected to the output node 122-1. A first diode Dl has an anode connected to the supply voltage node 124-1 and an anode connected to the node 306. In one example, D1 is a body diode of the transistor MP3. A second diode D2, which can be a body diode of the transistor MP6, has an anode connected to the output node 122-1 and a cathode connected to the node 306. In this configuration, the diodes D1 and D2 are blocking with respect to one another. In addition, a transistor MN6 includes a drain connected to the gate of MP3, a source connected to VSS, and a gate connected to the node 310-1 to receive the CTRL1 signal from the level shifting circuit 308-1. The control gate of MP3 receives a control voltage from MN6 according to the first control signal CTRL1 to turn on MP3 when the first supply drive circuit 200-1 is in the first mode (on), and to turn off MP3 off when the first supply drive circuit 200-1 is in the second mode (off). The circuit 302 also includes a transistor MP9 with a source connected to the drain of MN6, a drain terminal connected to the node 306, and a gate control terminal connected to the node 310-1. If VDD-1 is not available and the output node 122-1 is at a voltage level above VSS (e.g., at VDD-N when the signals VS-1-N and INN-1 are active HI), current flow to the VDD-1 supply voltage node 14-1 is blocked by MP3 and the diode Dl. Where VDD-1 is available, and where VDD-1 is lower than the voltage on the output node 122-1, MP3 is off when CTRL1 is LO, and MP3 and D1 block current flow from the output node 122-1 to the supply voltage node 124-1.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. An integrated circuit (IC), comprising:

a first supply voltage node[to deliver a first supply voltage signal];

a second supply voltage node[to deliver a second supply voltage signal]; *and* a first output circuit, including:

a first output node[to selectively provide an output signal to a first output pin of the IC according to a first data signal], a first supply drive circuit operative in a first mode to electrically connect the first supply voltage node to the first output node, and in a second mode to electrically disconnect the first supply voltage node from the first output node, *the first supply drive circuit including a first reset circuit to place the first supply drive circuit in the second mode responsive to a reset input signal,* and a second supply drive circuit operative in a first mode to electrically connect the second supply voltage node to the first output node, and in a second mode to electrically disconnect the second supply voltage node from the first output node[; and a second output circuit, wherein the first and second output circuits individually include a reset circuit to selectively place the corresponding output circuit in the second mode according to a reset input signal], *the second supply drive circuit including a second reset circuit to place the second supply drive circuit in the second mode responsive to the reset input signal.*

2. The IC of claim 1, wherein the first supply drive circuit includes a first supply drive control input to receive a first supply drive control signal, the first supply drive circuit operative in the first mode when the first supply drive control signal is in a first state and the first data signal is in a first state, the first supply drive circuit operative in the second mode when the first supply drive control signal is in a second state or the first data signal is in a second state; and wherein the second supply drive circuit includes a second supply drive control input to receive a second supply drive control signal, the second supply drive circuit operative in the first mode when the second supply drive control signal is in a first state and the first data signal is in a first state, the second supply drive circuit operative in the second mode when the second supply drive control signal is in a second state or the first data signal is in the second state.

3. The IC of claim 2, further comprising a logic circuit to provide one of the first and second supply drive control signals in the first state, and to provide the other supply drive control signal in the second state.

4. The IC of claim 2, wherein [the] *a* second supply voltage signal *at the second supply voltage node* is greater than [the] *a* first supply voltage signal *at the first supply voltage node*; and wherein the IC further comprises a blocking circuit to block current flow from the first output node to the first supply voltage node when the second supply drive control signal is in the first state.

5. The IC of claim 4, wherein the blocking circuit includes:

a first inverter, including an output, and an input receiving a first control signal, the first control signal having a first state when the first supply drive circuit is in the first mode and a different second state when the first supply drive circuit is in the second mode;

a first transistor, including a first terminal connected to the first supply voltage node, a second terminal connected to a first node, and a control terminal receiving a control voltage according to the first control signal to turn the first transistor on when the first supply drive circuit is in the first mode, and to turn the first transistor off when the first supply drive circuit is in the second mode;

a first diode, including an anode connected to the first supply voltage node, and a cathode connected to the first node;

a second transistor, including a first terminal connected to the first node, a second terminal connected to the first output node, and a control terminal connected to the output of the first inverter to turn the second transistor on when the first supply drive circuit is in the first mode, and to turn the second transistor off when the first supply drive circuit is in the second mode; and a second diode, including an anode connected to the first output node and a cathode connected to the first node.

6. The IC of claim 2, wherein the first output circuit includes:

a first AND gate, including a first input to receive the first supply drive control signal, a second input to receive the first data signal, and an output providing a first signal, and a first level shift circuit, including an input to receive the first signal from the first AND gate, and an output to provide a first control signal, and a first output transistor, including a first terminal coupled with the first supply voltage node, a second terminal connected to the first output node, and a control terminal to receive *a first gate control signal responsive to* the first control signal to turn the first output transistor on when the first supply drive circuit is in the first mode, and to turn the first output transistor off when the first supply drive circuit is in the second mode[; and wherein the second output circuit includes:

a second AND gate, including a first input to receive the second supply drive control signal, a second input to receive the first data signal, and an output providing a second signal, a second level shift circuit, including an input to receive the first signal from the first AND gate, and an output to provide a second control signal, and a second output transistor, including a first terminal connected to the second supply voltage node, a second terminal connected to the first output node, and a control to receive the second control signal to turn the second output transistor on when the second supply drive circuit is in the first mode, and to turn the second output transistor off when the second supply drive circuit is in the second mode].

7. The IC of claim 6, wherein the second supply voltage signal is greater than the first supply voltage signal; and wherein the IC further comprises a blocking circuit to block current flow from the first output node to the first supply voltage node when the second supply drive control signal is in the first state.

8. The IC of claim [6]*10*, wherein*:* [the first and second output circuits individually include a reset circuit to selectively]

*the third supply drive circuit includes a third reset circuit to* place the [corresponding output] *third supply drive* circuit in the second mode [according to a] *responsive to the* reset input signal*, and*

*the fourth supply drive circuit includes a fourth reset circuit to place the fourth supply drive circuit in the second mode responsive to the reset input signal.*

9. The IC of *claim* 1 [claim 11], wherein [the] *a* second supply voltage signal *at the second supply voltage node* is greater than [the] *a* first supply voltage signal *at the first supply voltage node*; and wherein the IC further comprises a blocking circuit to block current flow from the first output node to the first supply voltage node when the second supply drive control signal is in the first state.

10. The IC of claim 1, [wherein the] *further comprising a* second output circuit [includes] *including*:

a second output node[to selectively provide a second output signal to a corresponding second output pin of the IC according to a second data signal];

a third supply drive circuit operative in a first mode to electrically connect the first supply voltage node to the second output node, and in a second mode to electrically disconnect the first supply voltage node from the second output node; and a fourth supply drive circuit operative in a first mode to electrically connect the second supply voltage node to the second output node, and in a second mode to electrically disconnect the second supply voltage node from the second output node.

11. The IC of claim 10, wherein the first supply drive circuit includes a first supply drive control input to receive a first supply drive control signal, the first supply drive circuit operative in the first mode when the first supply drive control signal is in a first state and the first data signal is in a first state, the first supply drive circuit operative in the second mode when the first supply drive control signal is in a second state or the first data signal is in a second state;

wherein the second supply drive circuit includes a second supply drive control input to receive a second supply drive control signal, the second supply drive circuit operative in the first mode when the second supply drive control signal is in a first state and the first data signal is in a first state, the second supply drive circuit operative in the second mode when the second supply drive control signal is in a second state or the first data signal is in the second state;

wherein the third supply drive circuit includes a third supply drive control input to receive a third supply drive control signal, the third supply drive circuit operative in the first mode when the third supply drive control signal is in a first state and [the] *a* second data signal is in a first state, the third supply drive circuit operative in the second mode when the third supply drive control signal is in a second state or the second data signal is in a second state; and wherein the fourth supply drive circuit includes a fourth supply drive control input to receive a fourth supply drive control signal, the fourth supply drive circuit operative in the first mode when the fourth supply drive control signal is in a first state and the second data signal is in a first state, the fourth supply drive circuit operative in the second mode when the fourth supply drive control signal is in a second state or the second data signal is in the second state.

12. The IC of claim 11, further comprising a logic circuit to:

provide one of the first and second supply drive control signals in the first state;

provide the other one of the first and second supply drive control signals in the second state;

provide one of the third and fourth supply drive control signals in the first state; and provide the other one of the third and fourth supply drive control signals in the second state.

[13. An integrated circuit (IC), comprising:

an integer number N supply voltage nodes to deliver a corresponding integer number N supply voltage signals, N being greater than 1;

an integer number K output circuits, K being greater than 1, the individual output circuits including:

an output node to selectively provide an output signal to a corresponding output pin of the IC according to a corresponding data signal, and an integer number N supply drive circuits individually associated with a corresponding one of the N supply voltage nodes, individual supply drive circuits operative in a first mode in response to receiving a corresponding supply drive control signal in a first state and a corresponding data signal in a first state to selectively connect the corresponding supply voltage node to the output node, the individual supply drive circuits operative in a second mode in response to receiving the corresponding supply drive control signal in a second state to disconnect the corresponding supply voltage node from the output node; and a logic circuit operative for each of the K output circuits to provide a single one of the supply drive control signals in the first state and to provide the other supply drive control signals in the second state.]

[14. The IC of claim 13, wherein K is greater than 2.]

[15. The IC of claim 13, wherein the individual supply drive circuits include:

a level shift circuit to provide a control signal according to the corresponding supply drive control signal and the corresponding data signal; and an output transistor, including a first terminal coupled with the corresponding supply voltage node, a second terminal connected to the corresponding output node, and a control terminal to receive the control signal to turn the output transistor on when the supply drive circuit is in the first mode, and to turn the output transistor off when the supply drive circuit is in the second mode.]

[16. The IC of claim 15, wherein at least one of the supply drive circuits of each output circuit includes a blocking circuit to block current flow from the output node corresponding to the at least one supply drive circuit to the supply voltage node of the corresponding output circuit when the supply drive control signal is in the first state.]

[17. The IC of claim 13, wherein at least one of the supply drive circuits of each output circuit includes a blocking circuit to block current flow from the output node corresponding to the at least one supply drive circuit to the supply voltage node of the corresponding output circuit when the supply drive control signal is in the first state.]

[18. The IC of claim 13, wherein the output circuits individually include a reset circuit to selectively place the corresponding output circuit in the second mode according to a reset input signal.]

* * * * *